United States Patent
Sekine et al.

(10) Patent No.: US 9,076,786 B2
(45) Date of Patent: Jul. 7, 2015

(54) WIRING SUBSTRATE AND MANUFACTURING METHOD THEREFOR

(71) Applicant: NAPRA CO., LTD., Tokyo (JP)

(72) Inventors: Shigenobu Sekine, Tokyo (JP); Hiroaki Ikeda, Tokyo (JP); Yurina Sekine, Tokyo (JP)

(73) Assignee: NAPRA CO., LTD., Tokyo (JP)

( * ) Notice: Subject to any disclaimer, the term of this patent is extended or adjusted under 35 U.S.C. 154(b) by 0 days.

(21) Appl. No.: 14/446,621

(22) Filed: Jul. 30, 2014

(65) Prior Publication Data

US 2015/0041990 A1    Feb. 12, 2015

(30) Foreign Application Priority Data

Aug. 8, 2013  (JP) ................. 2013-165314

(51) Int. Cl.
| | |
|---|---|
| H01L 23/498 | (2006.01) |
| H01L 21/768 | (2006.01) |
| H01L 23/48 | (2006.01) |
| H01L 23/522 | (2006.01) |

(52) U.S. Cl.
CPC ......... *H01L 23/49827* (2013.01); *H01L 23/522* (2013.01); *H01L 21/76898* (2013.01); *H01L 23/481* (2013.01); *H01L 2924/0002* (2013.01); *H01L 21/76879* (2013.01); *H01L 23/49894* (2013.01)

(58) Field of Classification Search
CPC ....... H01L 23/48; H01L 23/52; H01L 23/522; H01L 23/49894; H01L 23/49827; H01L 21/76879
USPC ........................................ 257/774
See application file for complete search history.

(56) References Cited

U.S. PATENT DOCUMENTS

| | | | |
|---|---|---|---|
| 2006/0118965 A1 | 6/2006 | Matsui | |
| 2008/0237781 A1 | 10/2008 | Uchiyama | |
| 2009/0212438 A1 | 8/2009 | Kreupl et al. | |
| 2010/0301485 A1* | 12/2010 | Sekine et al. | 257/769 |
| 2011/0140281 A1* | 6/2011 | Sekine et al. | 257/774 |
| 2012/0091481 A1* | 4/2012 | Sekine et al. | 257/88 |
| 2012/0133710 A1* | 5/2012 | Joyner et al. | 347/61 |
| 2013/0075930 A1* | 3/2013 | Sekine et al. | 257/774 |
| 2013/0207241 A1* | 8/2013 | Lee et al. | 257/621 |
| 2013/0207242 A1* | 8/2013 | Lee et al. | 257/621 |

FOREIGN PATENT DOCUMENTS

| | | |
|---|---|---|
| EP | 2 743 937 A1 | 6/2014 |
| JP | 2006-165025 A | 6/2006 |
| JP | 2008-251964 A | 10/2008 |
| JP | 2009-111063 A | 5/2009 |
| JP | 2011-23497 A | 2/2011 |
| JP | 5225479 B2 | 7/2013 |

OTHER PUBLICATIONS

Extended European Search Report dated Dec. 9, 2014, issued in European Patent Application No. 14179882.7 (7 pages).

* cited by examiner

*Primary Examiner* — Nathan Ha
(74) *Attorney, Agent, or Firm* — Westerman, Hattori, Daniels & Adrian, LLP

(57) ABSTRACT

A wiring substrate includes a semiconductor substrate, an insulator and a plurality of columnar conductors. The insulator is made of an insulating material filled in a groove or hole provided in the semiconductor substrate. The plurality of columnar conductors are filled in grooves or holes provided in the insulator. The grooves or holes are arranged at a narrow pitch in a plane of the insulator. The insulating material has a Si—O bond obtained by reacting Si particles with an organic Si compound.

7 Claims, 15 Drawing Sheets

WIRING SUBSTRATE AND MANUFACTURING METHOD THEREFOR

BACKGROUND OF THE INVENTION

1. Field of the Invention

The present invention relates to a wiring substrate based on a TSV (through-silicon-via) technology and a manufacturing method therefor. More particularly, it relates to a wiring substrate based on a narrow-pitch TSV technology and a manufacturing method therefor.

2. Description of the Related Art

In order to realize a three-dimensional wiring substrate based on a TSV (through-silicon-via) technology, through electrodes have to be electrically insulated from a silicon substrate. As a means for electrical insulation, Japanese Unexamined Patent Application Publication No. 2008-251964 discloses a technology of providing a ring-shaped isolation groove passing through a silicon substrate and surrounding a through electrode, forming silicon films directly on bottom and side faces of the isolation groove, forming an insulation film on the silicon films so as to fill a space left in the isolation groove, and then thermally oxidizing the surface of the silicon films in contact with inner and outer peripheral side faces of the isolation groove so as to form a thermally oxidized silicon film.

However, since a sufficiently thick insulation film is difficult to form, a metallic component constituting the through electrode, e.g., Cu may be dispersed in the silicon oxide film and the silicon substrate, impairing the electrical insulating properties. Also, cracks may be formed in the insulation film, impairing the insulating properties.

Japanese Patent No. 5225479 discloses a technology effective in solving the above-described problems. The wiring substrate manufacturing method disclosed in Japanese Patent No. 5225479 includes an insulating layer formation process and a columnar conductor formation process. In the insulating layer formation process, a hole or groove is formed in a semiconductor substrate along its thickness direction and an insulating layer is formed in the hole or groove. In the columnar conductor formation process, a hole or groove is formed in a region surrounded by the insulating layer and a vertical columnar conductor containing a metal/alloy component is formed in the hole or groove.

According to the technology disclosed in Japanese Patent No. 5225479, it is possible to produce an insulator having excellent physical and chemical strength, a reliable insulator free from defects such as a gap, a void or a crack, and an insulator having various electrical properties.

However, Japanese Patent No. 5225479 does not disclose a narrow-pitch TSV technology, i.e., technology of forming a lot of vertical columnar conductors at a narrow pitch. When the arrangement pitch of the vertical columnar conductors is equal to or less than 4 μm, for example, even a slight misalignment of grooves or holes, in which the vertical columnar conductors are to be formed, may easily cause a failure such as poor connection. Japanese Patent No. 5225479 fails to disclose a means for preventing the occurrence of such a failure.

When TSVs are formed at a narrow pitch, moreover, the cross sectional area of columns to be used for supporting the vertical columnar conductors or insulators during the manufacturing process becomes too small, which may cause various failures during the manufacturing process, e.g., breakage of columns, misalignment of columns, or contact between columns. Japanese Patent No. 5225479 also fails to disclose a means for preventing the occurrence of such a failure.

SUMMARY OF THE INVENTION

It is an object of the present invention to provide a narrow-pitch TSV wiring substrate and a manufacturing method therefor.

It is another object of the present invention to provide a wiring substrate manufacturing method suitable for forming TSVs at a narrow pitch.

It is still another object of the present invention to provide a wiring substrate manufacturing method which can reduce the risk of various failures that may occur when a narrow pitch results in decreasing the cross sectional area of columns to be used for supporting insulators or columnar conductors, e.g., breakage of columns, misalignment of columns, or contact between columns.

In order to attain at least one of the above objects, a wiring substrate according to the present invention comprises a semiconductor substrate, an insulator and a plurality of columnar conductors. The insulator is made of an insulating material filled in a groove or hole provided in the semiconductor substrate. The plurality of columnar conductors are filled in grooves or holes provided in the insulator, the grooves or holes being arranged at a narrow pitch in a plane of the insulator. The insulating material has a Si—O bond obtained by reacting Si particles with an organic Si compound.

In the wiring substrate according to the present invention, as described above, the insulator is made of an insulating material filled in a groove or hole formed in the semiconductor substrate along a thickness direction thereof. Thus, the insulator is integrated with the semiconductor substrate (e.g., Si substrate).

The columnar conductors are filled in minute spaces extending in the thickness direction of the insulator integrated with the semiconductor substrate (e.g., Si substrate), the minute spaces being arranged at a narrow pitch in a plane of the insulator. This means that the individual columnar conductors are electrically insulated not only from each other but also from the semiconductor substrate by a common, single insulator. As compared with the case where a plurality of columnar conductors are arranged in a semiconductor substrate in a separately electrically insulated state (e.g., Japanese Patent No. 5225479), such an electrical insulation structure can greatly reduce the pitch distance between columnar conductors. According to the present invention, therefore, there can be realized a narrow-pitch TSV wiring substrate.

The wiring substrate according to the present invention may include an electronic element. Examples of such electronic elements include a wiring conductor, a wiring substrate and an electronic component, a conductive part of which is at least partially diffusion bonded to at least one of opposite ends of the columnar conductor. With this diffusion bonding, there can be realized a bonding structure having a high bonding strength and high heat resistance. Particularly when the conductive part of the electronic element is thermally diffusion bonded with a nanocomposite brazing alloy or nanocomposite particles, excellent thermal diffusion bond can be formed by a homogeneous disperse system composed of a few kinds of metal/alloy components, oxides, silicides, sulfides, etc. constituting the nanocomposite structure.

A method for manufacturing the foregoing wiring substrate according to the present invention comprises:

leaving a plurality of spaced columns of the semiconductor substrate in the insulator embedded in the semiconductor substrate; and removing the columns and filling the columnar conductors in resulting vacant spaces.

According to the present invention, as described above, since the spaced columns existing in the insulator embedded in the semiconductor substrate are removed and the columnar conductors are then filled in the resulting vacant spaces, the resulting vacant spaces (minute spaces) to be filled with the columnar conductors are surrounded and defined by the insulator and therefore prevented from varying in width and position. Therefore, TSVs can be certainly formed at a narrow pitch.

Furthermore, since the TSV technology is, as its name says, the art of forming electrically insulated vertical columnar conductors (through electrodes) in a semiconductor substrate such as silicon substrate, the spaced columns inside the insulator are made of the semiconductor substrate such as silicon substrate. Therefore, the columns can be easily, quickly and certainly removed by an etching technology that has been used on the semiconductor substrate such as silicon substrate. Thus, the vacant spaces to be filled with columnar conductors and therefore the columnar conductors can be easily, quickly and certainly formed.

Preferably, the wiring substrate manufacturing method according to the present invention includes: forming a plurality of spaced grooves or holes in the semiconductor substrate; and filling a fluid insulating material into the groove or holes and hardening it to form the insulator, wherein at the fluid insulating material-filling step, the columns are supported in contact with the semiconductor substrate or the hardened insulator.

As described above, the formation of TSVs at a narrow pitch, e.g., equal to or less than 4 μm, results in decreasing the cross sectional area of columns to be used for supporting the columnar conductors or insulators, e.g., equal to or less than 2 μm. Therefore, at the fluid insulating material-filling step, the columns affected by the filling pressure may cause various failures, e.g., breakage of columns, misalignment of columns, or contact between columns.

In the above, since the columns are supported in contact with the semiconductor substrate or the hardened insulator at the fluid insulating material-filling step, the mechanical strength of the columns can be increased to reduce the risk of various failures, e.g., breakage of columns, misalignment of columns, or contact between columns.

The fluid insulating material is preferably an insulating paste containing insulating particles, Si particles and an organic Si compound.

According to the present invention, as understood from above, the following advantages can be obtained.

(a) It is possible to provide a narrow-pitch TSV wiring substrate.
(b) It is possible to provide a wiring substrate manufacturing method suitable for forming TSVs at a narrow pitch.
(c) It is possible to provide a wiring substrate manufacturing method which can reduce the risk of various failures that may occur when a narrow pitch results in decreasing the cross sectional area of columns to be used for supporting insulators or columnar conductors at some point in the manufacturing process, e.g., breakage of columns, misalignment of columns, or contact between columns.

The present invention will be more fully understood from the detailed description given hereinbelow and the accompanying drawings which are given by way of illustration only, and thus not to be considered as limiting the present invention.

DESCRIPTION OF THE PREFERRED EMBODIMENTS

1. Wiring Substrate

Figure 1:
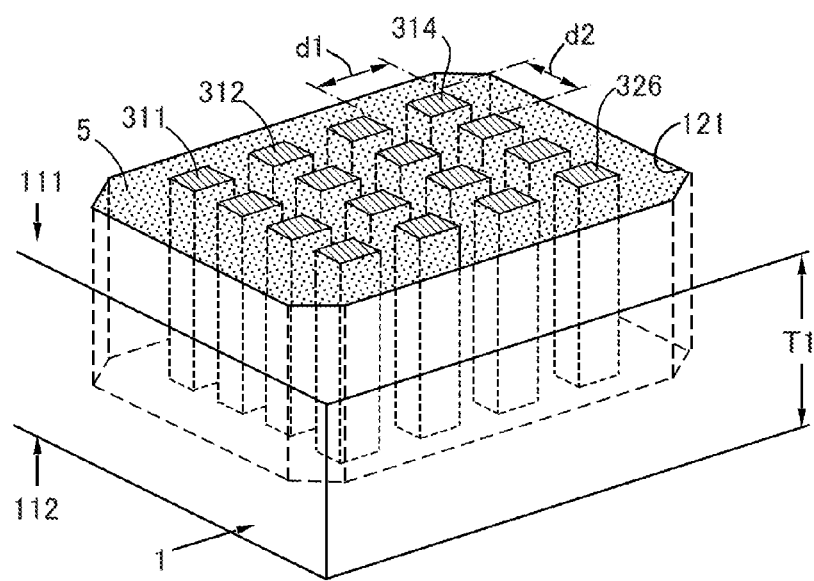
FIG. 1 is a perspective view showing a part of a wiring substrate according to the present invention.

FIG. 1 shows a part of a three-dimensional wiring substrate according to the present invention. In FIG. 1, a semiconductor substrate 1, which may be a silicon substrate having a thickness T1 equal to or less than 50 μm, encloses not only an insulator 5 but also a plurality of columnar conductors 311 to 326 (n=16) arranged at a narrow pitch d1, d2 in a plane of the insulator 5, wherein n may be any number.

The insulator 5 is filled in a minute space 121 formed in one surface 111 of the semiconductor substrate 1. Preferably, the insulator 5 is formed such that an insulating paste containing insulating particles, Si particles and a liquid organic Si compound is filled into a groove or hole (also referred to as minute space) 121 formed in the semiconductor substrate 1 along its thickness direction and then hardened. When the insulating paste filled in the minute space 121 is heat treated, the Si particles and the organic Si compound react with each other to form a Si—O bond, thereby providing an insulation structure in which the insulating particles serve as an aggregate with the Si—O bond filling up the space around the insulating particles. The insulating particles and the Si particles have a particle size of nanometer order (equal to or less than 1 μm). However, the insulating particles and the Si particles are not required to have a uniform particle size but may have various particle sizes within the nanometer range.

The columnar conductors 311 to 326 extend in the direction of the thickness T1 of the semiconductor substrate 1 to have one end appearing on one surface 111 of the semiconductor substrate 1. The columnar conductors 311 to 326 may be a columnar through conductor, the other end of which appears on a bottom surface 112 of the semiconductor substrate 1, or a columnar non-through conductor, the other end of which remains in the semiconductor substrate 1. In this embodiment, the columnar conductors 311 to 326 have a rectangular cross-section, but may have other polygonal shapes or a circular shape. Moreover, although they are arranged in a matrix with 4 rows and 4 columns, the number of rows and columns may arbitrary. The columnar conductors 311 to 326 may be formed by applying a known technology such as a plating process, a molten metal filling process or a conductive paste filling process. For example, the dimensions regarding the columnar conductors 311 to 326 are such that the arrangement pitch d1, d2 is in the range of 4 to 100 μm and the width is in the range of 0.5 to 25 μm. However, the arrangement pitch is not required to be a certain size, and the width is not limited to the above value either.

In the wiring substrate according to the present invention, as described above, the insulator 5 is made of an insulating material filled in the minute space 121 such as groove or hole formed in the semiconductor substrate 1 along the thickness direction. Thus, the insulator 5 is integrated with the semiconductor substrate 1 such as Si substrate.

The columnar conductors 311 to 326 are filled in minute spaces (e.g., grooves or holes) extending in the thickness direction of the insulator 5 integrated with the semiconductor substrate (e.g., Si substrate), the minute spaces being arranged at a narrow pitch d1, d2 in a plane of the insulator 5. This means that the individual columnar conductors 311 to 326 are supported together and electrically insulated not only from each other but also from the semiconductor substrate 1 by the single insulator 5. As compared with the case where a plurality of columnar conductors 311 to 326 are arranged in a semiconductor substrate 1 in a separately electrically insulated state (e.g., Japanese Patent No. 5225479), such an electrical insulation structure can greatly reduce the pitch d1, d2 between columnar conductors, e.g., to 4 μm or less. According to the present invention, therefore, there can be realized a narrow-pitch TSV wiring substrate.

The columnar conductors 311 to 326 contains at least one element selected from the group consisting of Ag, Cu, Au, Pt, Ti, Zn, Al, Fe, B, Si and Ni and at least one element selected from the group consisting of Sn, In, Bi and Ga. The first group consists of high melting point metal materials, while the second group consists of low melting point metal materials.

The number, shape and arrangement of the columnar conductors 311 to 326 may be arbitrarily determined in view of various factors, such as proper signal transmission paths and electrical properties required for signal transmission paths. Specific examples are shown in FIGS. 2 and 3.

Figure 2:
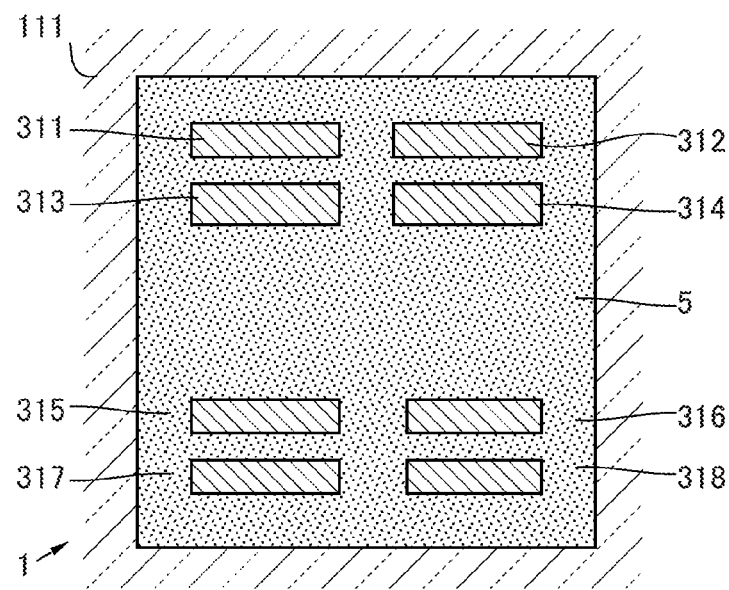
FIG. 2 is a drawing showing another embodiment of a wiring substrate according to the present invention.

FIG. 2 shows a specific example suitable for a power/ground line with a very close complementary signal path or return path. As shown in FIG. 2, columnar conductors (311, 313), (312, 314), (315, 317,) and (316, 318), which serve as a power/ground line, are filled in minute spaces formed in the insulator 5.

Figure 3:
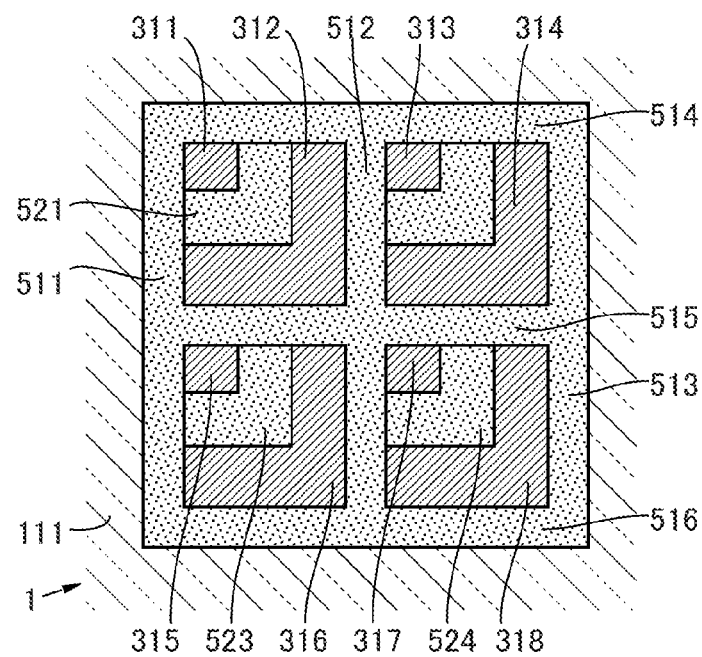
FIG. 3 is a drawing showing still another embodiment of a wiring substrate according to the present invention.

On the other hand, FIG. 3 shows a TSV structure suitable as a signal path with enhanced shielding effect. In this embodiment, the wiring substrate is configured such that L-shaped insulators 521 to 524 are formed in four rectangular regions defined by insulators (511 to 516) and columnar conductors 311 to 318 are filled in regions surrounded by the insulators (511 to 516) and the insulators (521 to 524). Of course, this wiring substrate is also included within the scope of the present invention.

In the above, since the columnar conductors 311 to 318 are filled in the regions surrounded by the hardened insulators (511 to 516) and (521 to 524), TSVs can be certainly formed at a narrow pitch without varying in width and position.

The wiring substrate according to the present invention may be combined with an electronic element. Examples of such electronic elements include a wiring conductor, a wiring substrate and an electronic component, a conductive part of which is at least partially diffusion bonded to at least one of opposite ends of the columnar conductor. Specific examples are shown in FIGS. 4 and 5.

Figure 4:
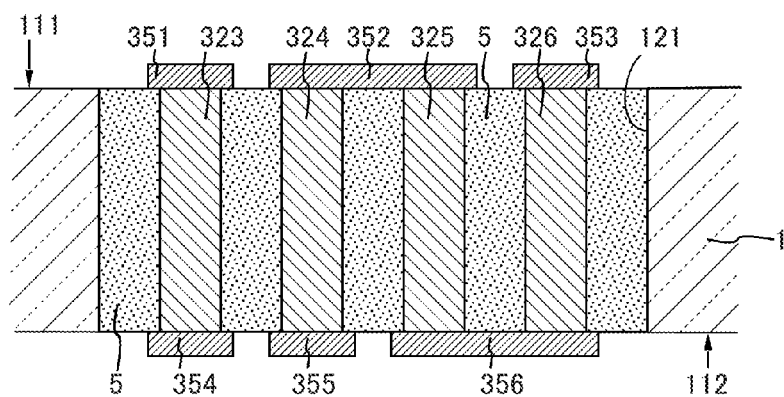
FIG. 4 is a drawing showing yet another embodiment of a wiring substrate according to the present invention.

Referring first to FIG. 4, conductors (electronic elements) 351 to 356 are liquid-phase or solid-phase diffusion bonded to opposite ends of the columnar conductors 323 to 326. With this diffusion bonding, a bonding structure having a high bonding strength and high heat resistance can be realized between the conductors 351 to 356 and the columnar conductors 323 to 326. Particularly when the conductors (electronic elements) 351 to 356 are thermally diffusion bonded with a nanocomposite brazing alloy or nanocomposite particles, excellent liquid-phase or solid-phase diffusion bond can be formed by a metal/alloy component of the nanocomposite structure. The nanocomposite structure refers to a structure in which metals, alloys or compounds thereof are integrated and combined. The nanocomposite brazing alloy or nanocomposite particles may include a combination of a high melting point metal material and a low melting point metal material.

Figure 5:
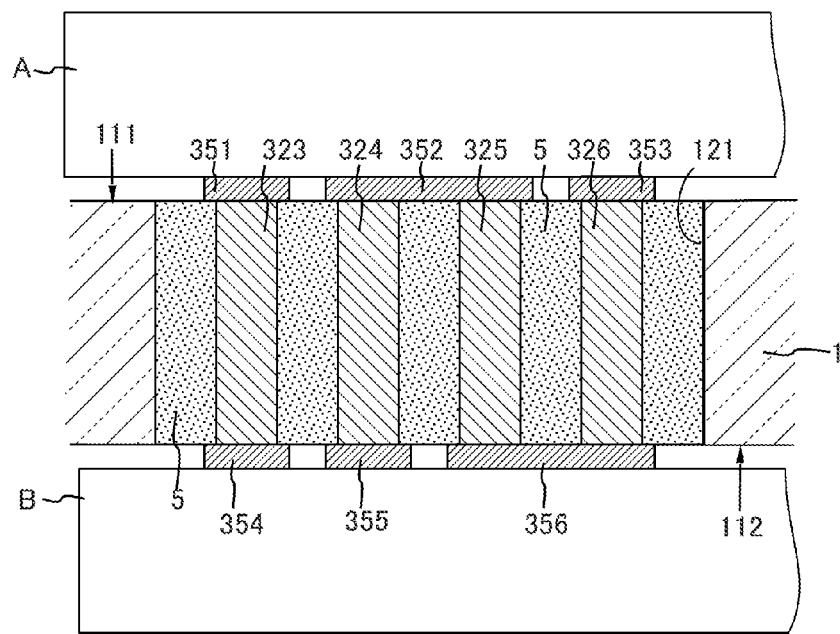
FIG. 5 is a drawing showing yet another embodiment of a wiring substrate according to the present invention.

On the other hand, FIG. 5 shows a case where a wiring substrate and an electronic component are used as an electronic element. In FIG. 5, the conductors 351 to 356 disposed on a wiring substrate B or an electronic component A are diffusion bonded to opposite ends of the columnar conductors 323 to 326. With this diffusion bonding, a bonding structure having a high bonding strength and high heat resistance can be realized between the conductors 351 to 356 and the columnar conductors 323 to 326. When the conductors 351 to 356 of the electronic elements are thermally diffusion bonded with a nanocomposite brazing alloy or nanocomposite particles, excellent thermal diffusion bond can be formed by a metal/alloy component of the nanocomposite structure.

The electronic component A may be an active element or a passive element. Typically, such an active element may be a system LSI, a memory LSI, an image sensor, a MEMS in the form of a three-dimensional system-in-package (3D-SiP). It may also be an electronic device including an analog or digital circuit, a memory circuit such as DRAM, a logic circuit such as CPU or the like or an electronic equipment that is obtained by preparing different types of circuits such as an analog high frequency circuit and a low frequency, low power consumption circuit in different processes and stacking them.

Moreover, it includes most of electronic equipments or devices having an electronic circuit as a functional element, such as a sensor module, an optoelectronic module, a unipolar transistor, a MOS FET, a CMOS FET, a memory cell, integrated circuits (IC) thereof, or various scales of LSIs. In the present invention, integrated circuits called "LSI" include all types of integrated circuits such as a small-scale integration, a medium-scale integration, a large-scale integration, a very-large-scale integration (VLSI), an ultra-large-scale integration (ULSI), and so on.

The wiring substrate B may be of the type shown in FIGS. 1 to 3 or other types.

In the various types of wiring substrates described above, the type of the semiconductor substrate 1 and the shape, arrangement and width of the columnar conductors may be different from those described in this specification. Even then, as long as the structure of the insulator and the relationship of the insulator to the columnar conductors satisfy the requirements, the wiring substrate is included in the scope of the present invention.

2. Method for Manufacturing Wiring Substrate

Figure 6:
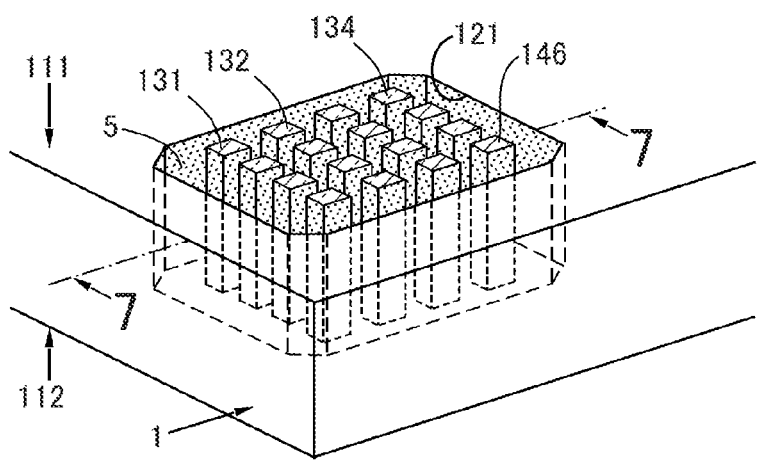
FIG. 6 is a drawing showing one step included in a method for manufacturing the wiring substrate shown in FIGS. 1 to 5.
Figure 7:
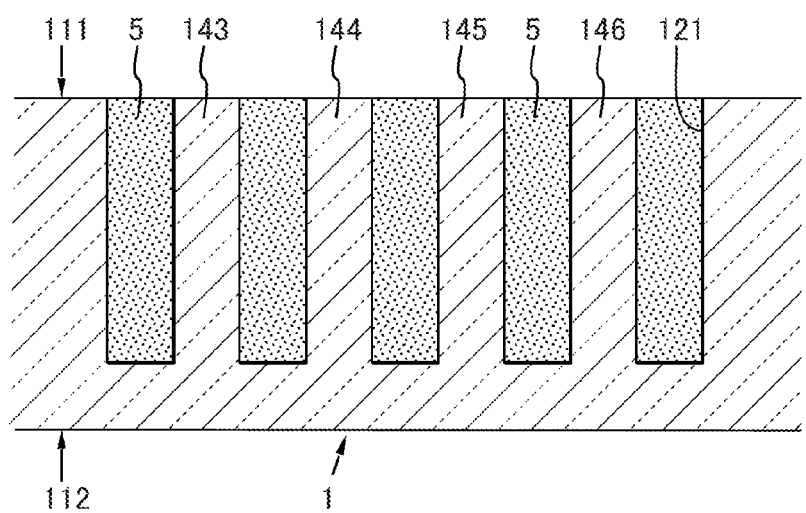
FIG. 7 is an enlarged sectional view taken along the line 7-7 in FIG. 6.

Hereinbelow, a method for manufacturing the wiring substrate shown in FIGS. 1 to 3 will be described with reference to FIGS. 6 to 24. Referring to FIGS. 6 and 7, the insulator 5 is formed in a minute space 121 that is formed in one surface 111 of the semiconductor substrate 1 along the thickness direction. The minute space 121 is a blind hole. In a plane of the insulator 5, columns 131 to 146 made of the semiconductor substrate 1 are arranged in a matrix. One end of each of the columns 131 to 146 in the thickness direction appears on the surface of the insulator 5, while the opposite end (bottom) is continuous with the semiconductor substrate 1.

Figure 8:
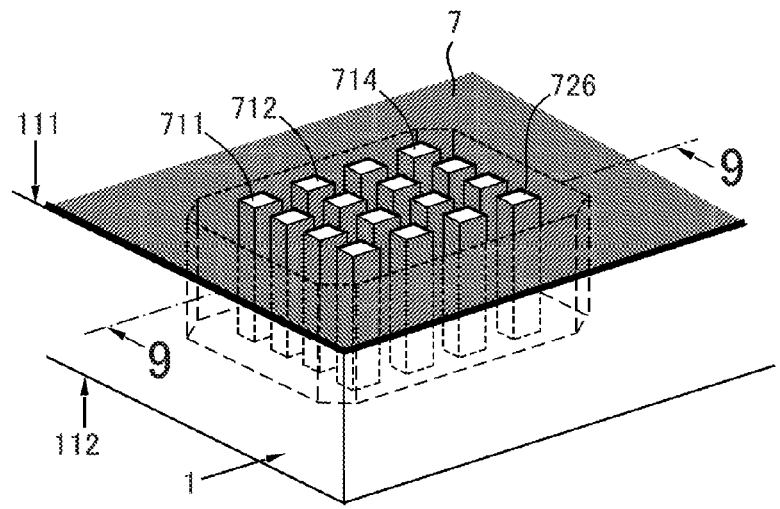
FIG. 8 is a drawing showing a step after the step shown in FIGS. 6 and 7.
Figure 9:
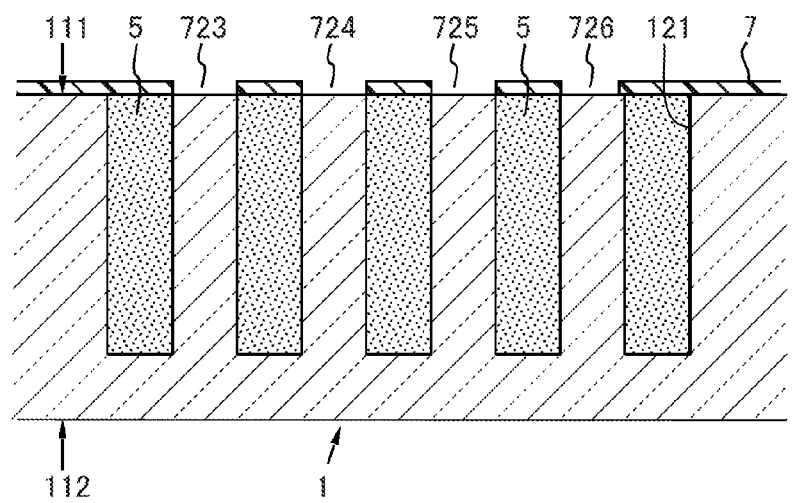
FIG. 9 is an enlarged sectional view taken along the line 9-9 in FIG. 8.

Then, as shown in FIGS. 8 and 9, a mask 7 is formed on the surface 111 of the semiconductor substrate 1. The mask 7 is a resist mask formed by a high precision patterning technology including a photolithography process. The mask 7 has cut-out patterns 711 to 726 at areas which face the upper ends of the columns 131 to 146 in the thickness direction.

Figure 10:
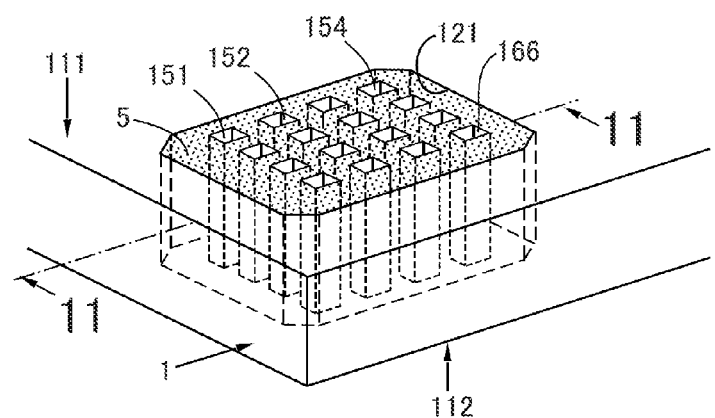
FIG. 10 is a drawing showing a step after the step shown in FIGS. 8 and 9.
Figure 11:
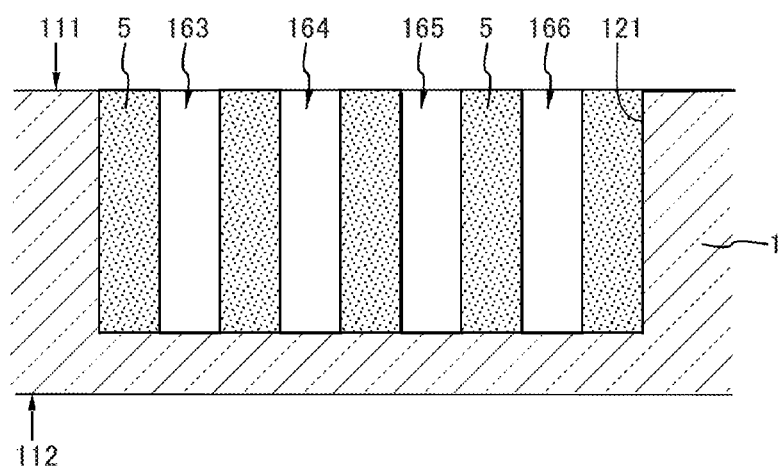
FIG. 11 is an enlarged sectional view taken along the line 11-11 in FIG. 10.

Through the cut-out patterns 711 to 726 of the mask 7, the columns 131 to 146 are deeply etched by a known technology such as a CVD process or a laser drilling process. FIGS. 10 and 11 show a state after the completion of the etching process, in which the resulting vacant spaces, from which the columns 131 to 146 are removed, are depicted as minute spaces 151 to 166.

Figure 12:
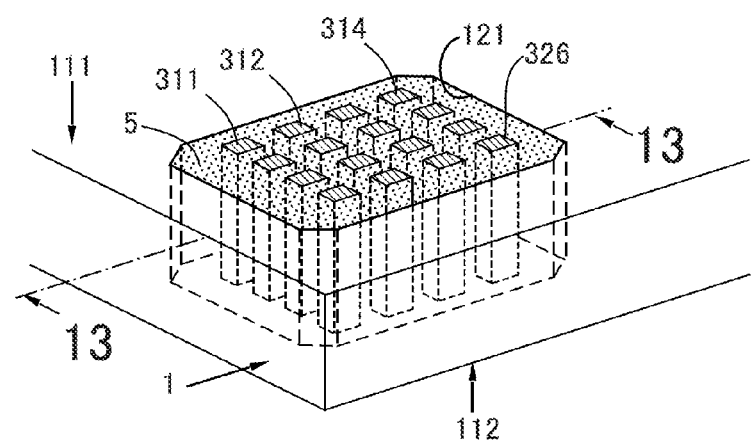
FIG. 12 is a drawing showing a step after the step shown in FIGS. 10 and 11.
Figure 13:
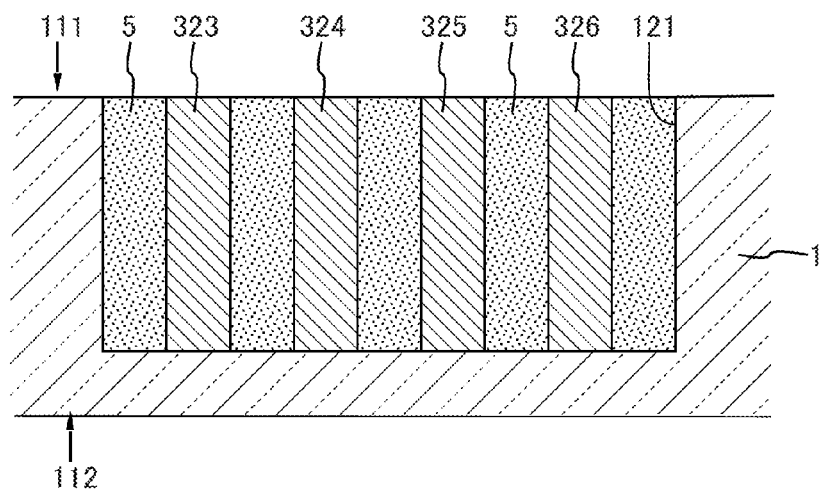
FIG. 13 is an enlarged sectional view taken along the line 13-13 in FIG. 12.

Then, as shown in FIGS. 12 and 13, the columnar conductors 311 to 326 are filled in the minute spaces 151 to 166. For example, the dimensions regarding the columnar conductors 311 to 326 are such that the arrangement pitch is in the range of 4 to 100 μm and the width is in the range of 0.5 to 25 μm. However, the arrangement pitch is not required to be a certain size, and the width is not limited to the above value either.

The columnar conductors 311 to 326 can be formed by applying a known technology such as a plating process, a molten metal filling process or a conductive paste filling process. Among them, the molten metal filling process is preferred from the viewpoint of forming high quality conductors and reducing the production cost. Examples of metal or alloy for use in the molten metal filling process include high melting point metal materials and low melting point metal materials produced with nanocomposite metal/alloy particles.

As described above, since the spaced columns 131 to 146 existing in the insulator 5 embedded in the semiconductor substrate 1 are removed, the resulting vacant spaces (minute spaces 151 to 166) to be filled with the columnar conductors 311 to 326 are surrounded and defined by the insulator 5 and therefore prevented from varying in width and position. Therefore, TSVs can be certainly formed at a narrow pitch.

Furthermore, since the TSV technology is, as its name says, the art of forming electrically insulated columnar conductors (through electrodes) in a semiconductor substrate such as silicon substrate, the spaced columns 131 to 146 inside the insulator 5 are made of the semiconductor substrate 1 such as silicon substrate. Therefore, the columns 131 to 146 can be easily, quickly and certainly removed by an etching technology that has been used on the semiconductor substrate 1 such as silicon substrate, for example, a known technology such as a CVD process or a laser drilling process. Thus, the minute spaces 151 to 166 to be filled with the columnar conductors 311 to 326 and therefore the columnar conductors 311 to 326 can be easily, quickly and certainly formed.

Figure 14:
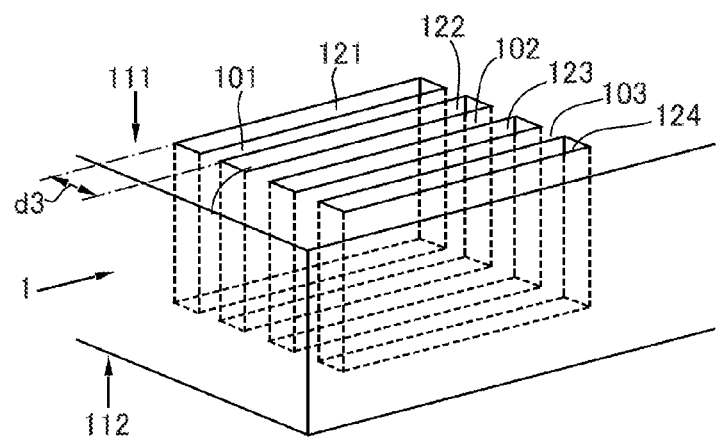
FIG. 14 is a drawing showing one step included in another method for manufacturing the wiring substrate according to the present invention.

Another method for manufacturing the wiring substrate according to the present invention will be described with reference to FIGS. 14 to 20. At first, as shown in FIG. 14, four minute spaces 121 to 124, for example, in the shape of a groove are formed in the surface 111 of the semiconductor substrate 1 at intervals d3. Such minute spaces 121 to 124 can be formed (deeply etched) by an etching technology that has been used on the semiconductor substrate 1 such as silicon substrate, for example, a known technology such as a CVD process or a laser drilling process. The minute spaces 121 to 124 may or may not pass through the semiconductor substrate 1 from the first surface 111 to the second surface 112. The minute spaces 121 to 124 are formed such that the arrangement pitch is in the range of 4 to 100 μm and the groove width is in the range of 0.5 to 25 μm. However, the arrangement pitch is not required to be a certain size, and the groove width is not limited to the above value either.

Between the minute spaces 121 to 124, there are left long and narrow columns 101 to 103 of the semiconductor substrate 1. These columns 101 to 103 are supported with their opposite ends in the length direction being continuous with the rest of the semiconductor substrate 1.

Figure 15:
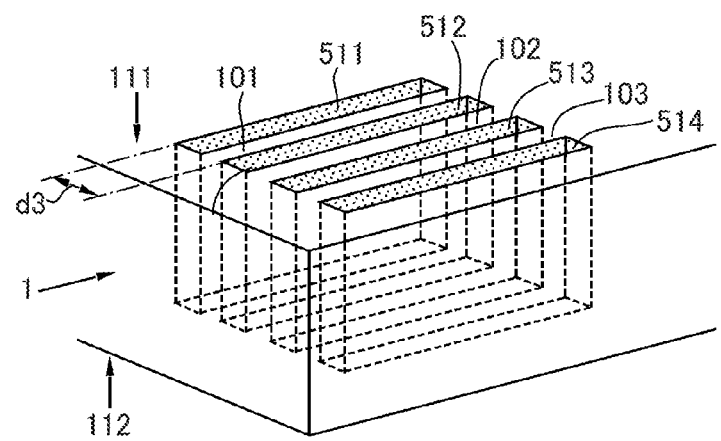
FIG. 15 is a drawing showing a step after the step shown in FIG. 14.

Then, as shown in FIG. 15, a fluid insulating material is filled into the minute spaces 121 to 124 and hardened to form insulators 511 to 514. At this point, the columns 101 to 103 existing between the minute spaces 121 to 124 are supported with their opposite ends in the length direction being continuous with the rest of the semiconductor substrate 1. In the process of filling a fluid insulating material into the minute spaces 121 to 124 for formation of the insulators 511 to 514, therefore, even though a narrow pitch, e.g., equal to or less than 4 μm, results in decreasing the cross sectional area of the columns 101 to 103, it is possible to reduce the risk of various failures, e.g., breakage of the columns 101 to 103, misalignment of the columns 101 to 103, or contact between the columns 101 to 103.

The fluid insulating material is preferably an insulating paste containing insulating particles, Si particles and an organic Si compound. It is also possible to pour a liquid organic Si compound after the insulating particles and the Si particles are put in the minute spaces. In order to harden the fluid insulating material filled in the minute spaces 121 to 124 for formation of the insulators 511 to 514, the organic Si compound is reacted with the Si particles to form the Si—O bond network filling up the space around the insulating particles. Preferably, the reaction between the organic Si compound and the Si particles is allowed to proceed under vacuum while being heated, for example, within a temperature range of 130° C. to 150° C. Thus, the insulators 511 to 514 can be formed. Organic substances resulting from the reaction can be thermally decomposed and discharged as a gas.

The insulators 511 to 514 have a structure in which the space around the insulating particles is completely filled up with the Si—O bond network, more specifically, amorphous silica (SiO$_2$).

More preferably, heating is performed such that the fluid insulating material filled in the minute spaces 121 to 124 is heated under pressure and then cooled under pressure. This process further accelerates the thermal decomposition of the organic substances and also increases the density of the insulators 511 to 514, improving the adhesion to the semiconductor substrate 1.

By performing the above process, the insulators 511 to 514 with excellent physical and chemical strength can be formed in the minute spaces 121 to 124.

Moreover, the Si—O bond filling up the space around the insulating particles, more specifically, the amorphous silica (SiO$_2$) can be formed by reacting the organic Si compound with the Si particles. That is, since the formation of the oxide from the Si particles increases the volume, a reliable insulator can be formed in the minute space, which is free from defects such as a gap, a void or a crack and has a high adhesion strength to the side wall of the minute space. It should be noted that the volume of the SiO$_2$ increases by about 30 to 35% from that of the Si particles. This corresponds to the shrinkage ratio of the Si particles, preventing the formation of a void, a gap or a crack due to the shrinkage.

Furthermore, since the fluid insulating material according to the present invention contains the insulating particles, the insulator can be provided with various electrical properties based on the properties of the insulating particles. Basically, the insulating particles are metal oxide particles (ceramic). For instance, when the insulating particles comprise a ferroelectric material such as barium titanate, the insulator can be provided with a large capacitance; when the insulating particles comprise a low dielectric material such as SiO$_2$ or Al$_2$O$_3$, the insulator can be provided with a small capacitance.

A typical example of the organic Si compound to be used in the present invention is alkylalkoxysilane represented by the formula:

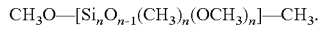

In this case, the reaction formula is as follows.

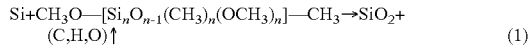 (1)

When the semiconductor substrate 1 having the minute spaces 121 to 124 is a Si semiconductor substrate, the above reaction also occurs with Si of the Si semiconductor substrate. Alternatively, it is also possible to use organopolysiloxane (alkoxysilane having a functional side chain).

The Si particles may be formed by heat treating a silicon oil put in the minutes spaces 121 to 124. The silicon oil may be dimethylpolysiloxane (C$_2$H$_6$OSi)$_n$.

Figure 16:
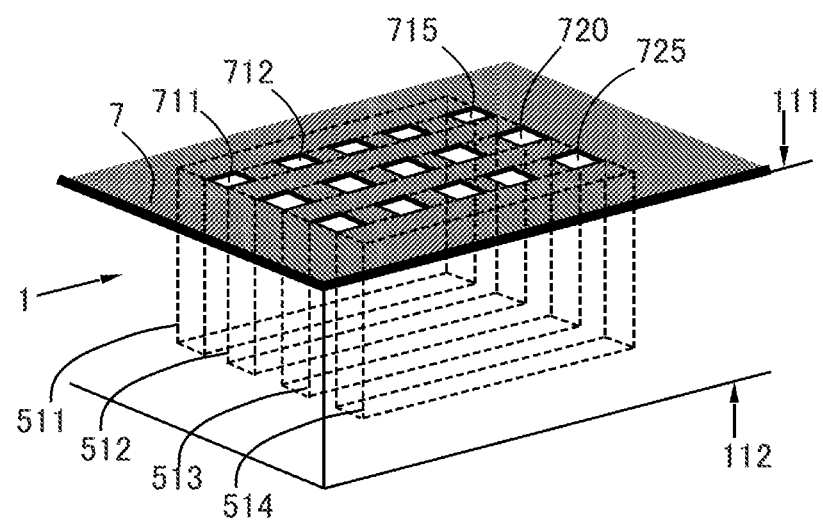
FIG. 16 is a drawing showing a step after the step shown in FIG. 15.

Then, as shown in FIG. 16, a mask 7 is placed on the surface 111 of the semiconductor substrate 1. The mask 7 is a resist mask formed by a high precision patterning technology. The mask 7 has cut-out patterns 711 to 725 which open at areas between the minute spaces 121 to 124 and are arranged in a matrix at regular intervals.

Figure 17:
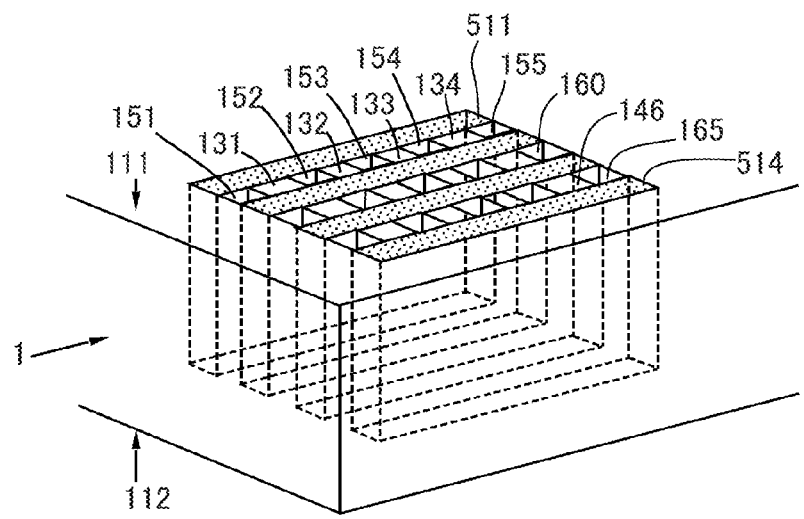
FIG. 17 is a drawing showing a step after the step shown in FIG. 16.

Through the cut-out patterns 711 to 725 of the mask 7, the semiconductor substrate 1 is deeply etched by a known technology such as a CVD process or a laser drilling process. FIG. 17 shows a state after the completion of the etching process, in which minute spaces 151 to 165 are created by etching the semiconductor substrate 1 according to the cut-out patterns 711 to 725. Between the minute spaces 151 to 165, columns 131 to 146 made of the semiconductor substrate 1 are left. The columns 131 to 146 are supported with their side faces in contact with the hardened insulators 511 to 514.

Figure 18:
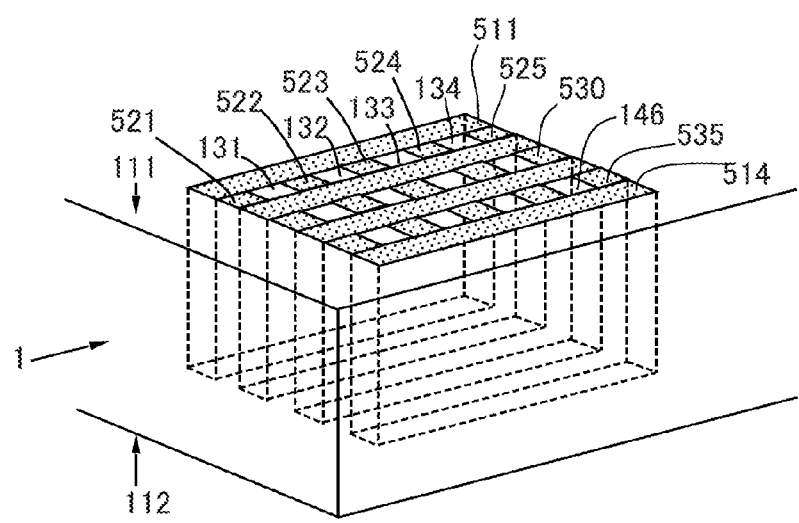
FIG. 18 is a drawing showing a step after the step shown in FIG. 17.

Then, as shown in FIG. 18, a fluid insulating material is filled into the minute spaces 151 to 165 and hardened to form insulators 521 to 535. This fluid insulating material is the above-mentioned insulating paste containing insulating particles, Si particles and an organic Si compound. It is also possible to pour a liquid organic Si compound after the insulating particles and the Si particles are put in the minute spaces.

At this point, the columns 131 to 146 are supported with their side faces in contact with the hardened insulators 511 to 514. In the process of filling a fluid insulating material into the minute spaces 151 to 165, therefore, even though a narrow pitch, e.g., equal to or less than 4 μm, results in decreasing the cross sectional area of the columns 131 to 146, it is possible to reduce the risk of various failures, e.g., breakage of the columns 131 to 146, misalignment of the columns 131 to 146, or contact between the columns 131 to 146.

Figure 19:
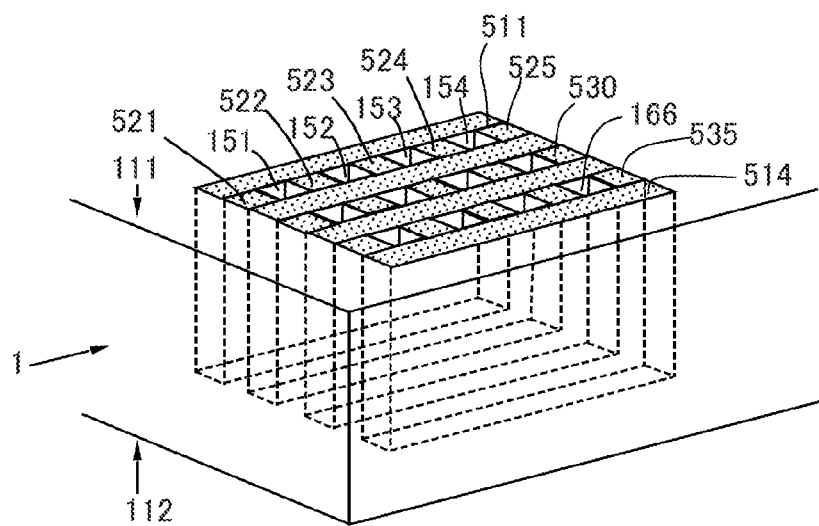
FIG. 19 is a drawing showing a step after the step shown in FIG. 18.

Then, a mask is placed on the surface 111 of the semiconductor substrate 1, and the semiconductor substrate 1 is deeply etched through cut-out patterns of the mask by a known technology such as a CVD process or a laser drilling process (see FIGS. 8 to 11). FIG. 19 shows a state after the completion of the etching process, in which minute spaces 151 to 166 are created by etching the semiconductor substrate 1 according to the cut-out patterns of the mask. The minute spaces 151 to 166 are surrounded by the hardened insulators 511 to 514, 521 to 535.

Figure 20:
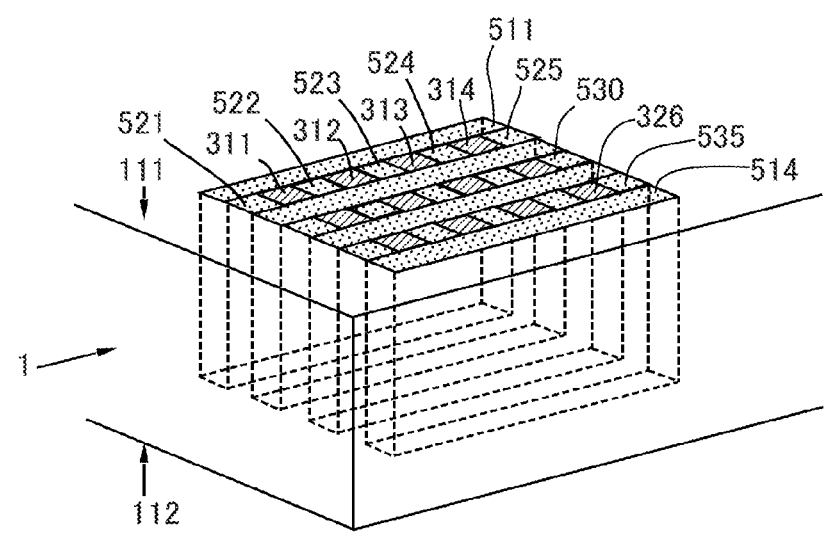
FIG. 20 is a drawing showing a step after the step shown in FIG. 19.

Then, as shown in FIG. 20, columnar conductors 311 to 326 are filled in the minute spaces 151 to 166. As described above, the columnar conductors 311 to 326 can be formed by applying a known technology such as a plating process, a molten metal filling process or a conductive paste filling process. For example, the dimensions regarding the columnar conductors 311 to 326 are such that the arrangement pitch is in the range of 4 to 100 μm and the width is in the range of 0.5 to 25 μm. However, the arrangement pitch is not required to be a certain size, and the width is not limited to the above value either.

In the above, since the columnar conductors 311 to 326 are filled in the minute spaces 151 to 166 surrounded by the insulators 511 to 514, 521 to 535, TSVs can be certainly formed at a narrow pitch without varying in width and position.

Furthermore, the spaced columns 131 to 146 left in the insulator 5 are made of the semiconductor substrate 1 such as silicon substrate. Therefore, the columns 131 to 146 can be easily, quickly and certainly removed by an etching technology that has been used on the semiconductor substrate 1 such as silicon substrate, for example, a known technology such as a CVD process or a laser drilling process. Thus, the minute spaces 151 to 166 to be filled with the columnar conductors 311 to 326 and therefore the columnar conductors 311 to 326 can be easily, quickly and certainly formed.

Figure 21:
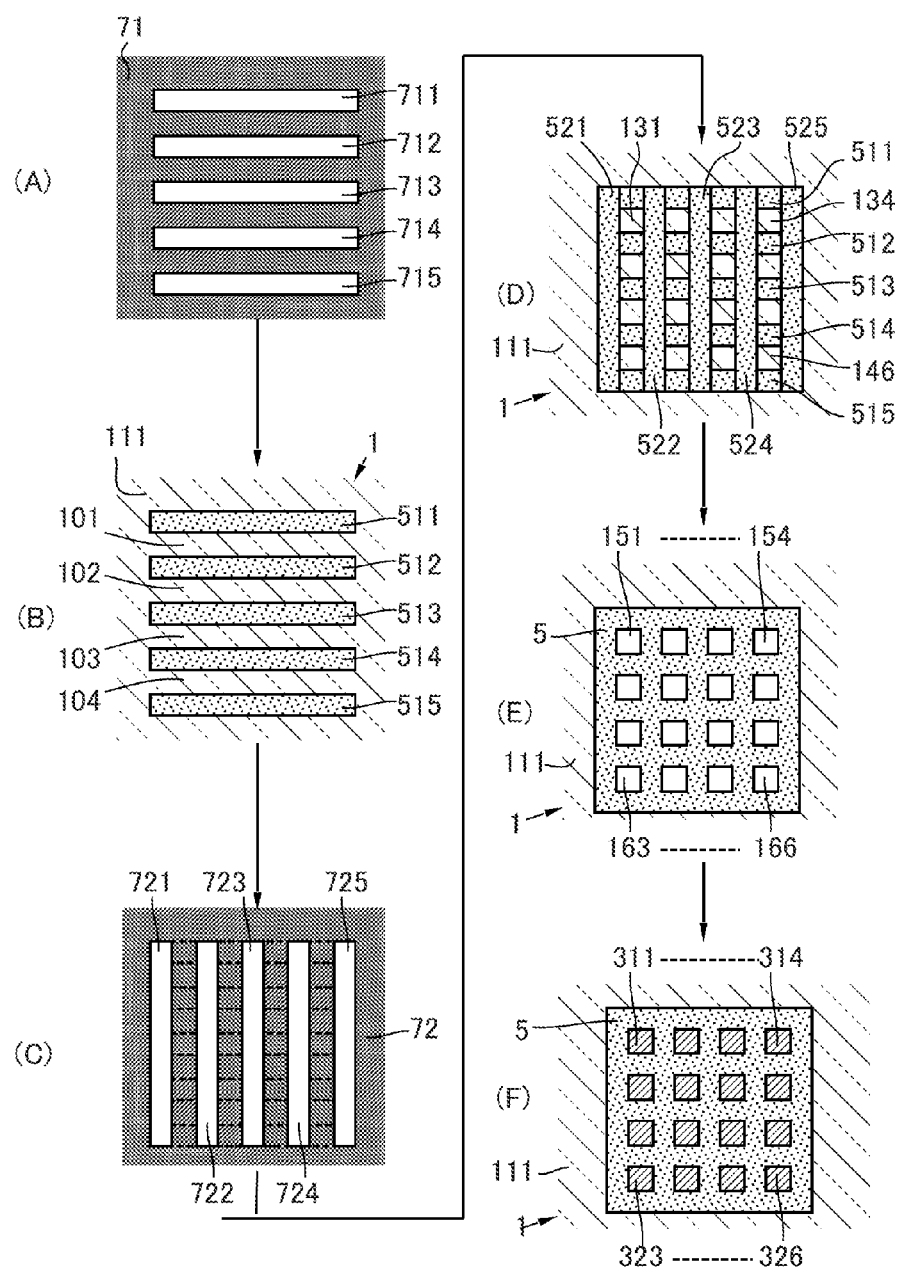
FIG. 21 is a drawing showing still another method for manufacturing the wiring substrate according to the present invention.
Figure 22:
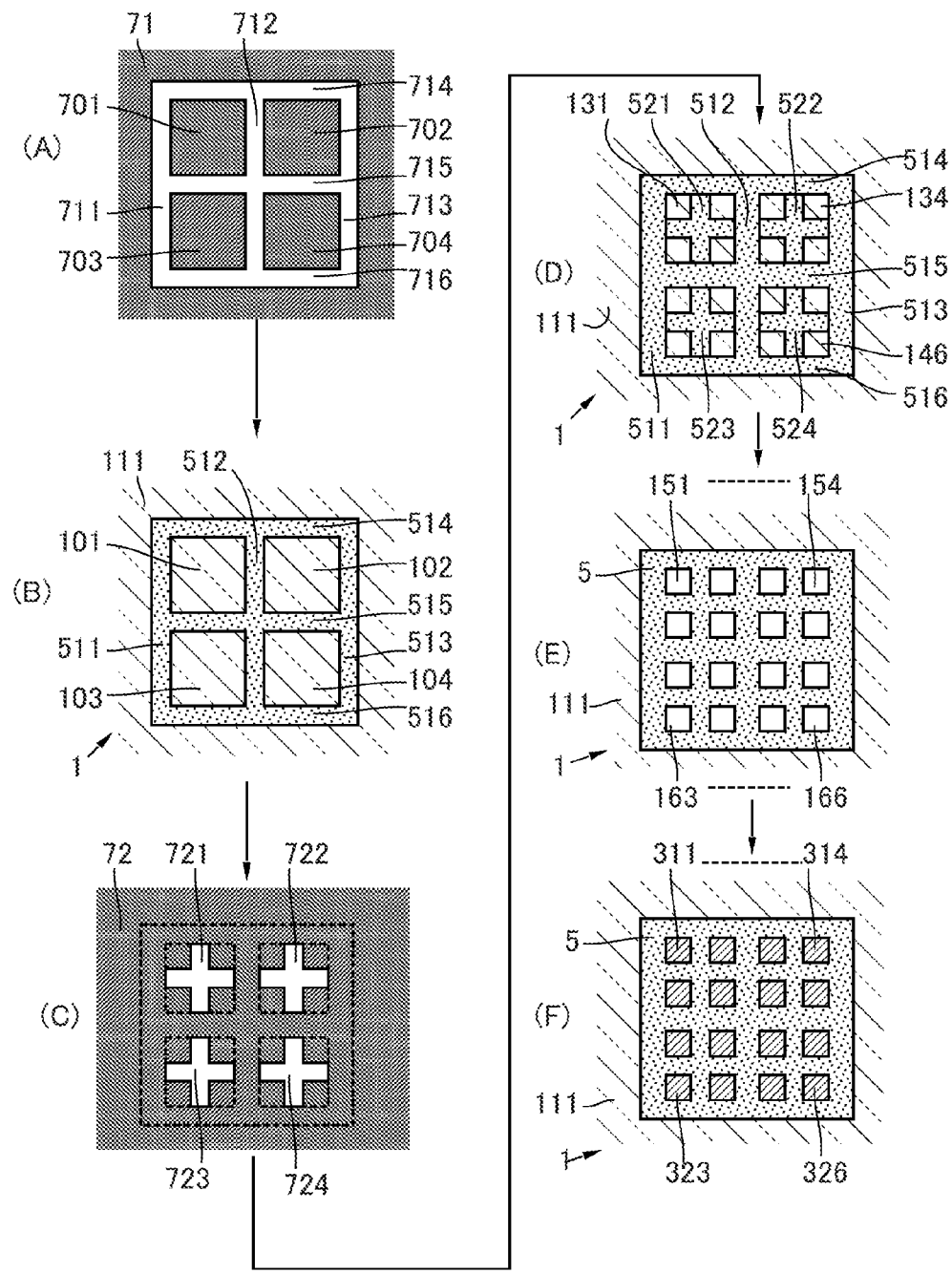
FIG. 22 is a drawing showing yet another method for manufacturing the wiring substrate according to the present invention.

Further description will be made with reference to FIGS. 21 and 22. At first, as shown in FIG. 21(A), minute spaces are deeply etched in the surface 111 of the semiconductor substrate 1 (not shown) according to the cut-out patterns 711 to 715 of a resist mask 71. Then, as shown in FIG. 21(B), a fluid insulating material is filled into the minute spaces and hardened to form insulators 511 to 515. Between the insulators 511 to 515, there are left long and narrow columns 101 to 104 made of the semiconductor substrate 1. These columns 101 to 104 are supported with their opposite ends in the length direction being continuous with the rest of the semiconductor substrate 1. In the process of filling a fluid insulating material into the minute spaces for formation of the insulators 511 to 515, therefore, even though a narrow pitch, e.g., equal to or less than 4 μm, results in decreasing the cross sectional area of the columns 101 to 104, it is possible to reduce the risk of various failures, e.g., breakage of the columns 101 to 104, misalignment of the columns 101 to 104, or contact between the columns 101 to 104.

Then, as shown in FIG. 21(C), a resist mask 72 having cut-out patterns 721 to 725 is formed on the surface 111 of the semiconductor substrate 1 appearing in FIG. 21(B), and minute spaces are formed according to the cut-out patterns 721 to 725 of the resist mask 72. The cut-out patterns 721 to 725 of the resist mask 72 are formed at right angles to the cut-out patterns 711 to 715 of the resist mask 71.

Then, as shown in FIG. 21(D), a fluid insulating material is filled into the minute spaces and hardened to form insulators 521 to 525. As a result, columns 131 to 146 are formed surrounded by the insulators 511 to 515 and the insulators 521 to 525.

In the process of forming the insulators 521 to 525, the columns 131 to 146 are supported with their side faces in contact with the insulators 511 to 514. Therefore, even though a narrow pitch, e.g., equal to or less than 4 μm, results in decreasing the cross sectional area of the columns 131 to 146, it is possible to reduce the risk of various failures, e.g., breakage of the columns 131 to 146, misalignment of the columns 131 to 146, or contact between the columns 131 to 146.

Then, as shown in FIG. 21(E), the columns 131 to 146 are deeply etched to form minute spaces 151 to 166. Thereafter, as shown in FIG. 21(F), columnar conductors 311 to 326 are filled in the minute spaces 151 to 166. In the above, since the columnar conductors 311 to 326 are filled in the minute spaces 151 to 166 surrounded by the hardened insulator 5, TSVs can be certainly formed at a narrow pitch without varying in width and position.

Furthermore, the columns 131 to 146 can be easily, quickly and certainly removed by an etching technology that has been used on the semiconductor substrate 1 such as silicon substrate, for example, a known technology such as a CVD process or a laser drilling process. Thus, the minute spaces 151 to 166 to be filled with the columnar conductors 311 to 326 and therefore the columnar conductors 311 to 326 can be easily, quickly and certainly formed.

Hereinbelow, another embodiment will be described with reference to FIG. 22. FIG. 22 shows a method effective in preventing the filled regions from being damaged by deep etching. At first, as shown in FIG. 22(A), minute spaces are formed in the surface 111 of the semiconductor substrate 1 (not shown) according to cut-out patterns 711 to 716 of a resist mask 71. Then, as shown in FIG. 22(B), a fluid insulating material is filled into the minute spaces and hardened to form insulators 511 to 516.

The resist mask 71 has a cut-out pattern that is a combination of a plurality of longitudinal patterns 711 to 713 and a plurality of lateral patterns 714 to 716 and rectangular mask patterns 701 to 704 surrounded by the longitudinal patterns 711 to 713 and the lateral patterns 714 to 716. The number of the longitudinal patterns 711 to 713 and the lateral patterns 714 to 716 may be arbitrary.

As described above, after the minute spaces are formed according to the cut-out patterns 711 to 716 of the resist mask 71, the insulators 511 to 516 are formed by hardening the fluid insulating material filled into the minute spaces. In this case, the insulators 511 to 516 are formed according to the cut-out patterns 711 to 716 of the resist mask 71, while rectangular columns 101 to 104 are formed surrounded by longitudinal patterns 511 to 513 and lateral patterns 514 to 516 constituting the insulators 511 to 516.

Then, as shown in FIG. 22(C), a resist mask 72 having cut-out patterns 721 to 724 is formed on the surface 111 of the semiconductor substrate 1 appearing in FIG. 22(B), and minute spaces are formed according to the cut-out patterns 721 to 724 of the resist mask 72. The cut-out patterns 721 to 724 of the resist mask 72 are formed at right angles to the cut-out patterns 711 to 716 of the resist mask 71 so that they can meet each other. Specifically, the individual cut-out patterns 721 to 724 are in the shape of a cross that is at right angles to the longitudinal patterns 511 to 513 and the lateral patterns 514 to 516, which constitute the insulators 511 to 516 defining the rectangular columns 101 to 104.

Since deep etching according to the cut-out patterns 721 to 724 of the resist mask 72 does not scrape off the insulators 511 to 516, the insulators 511 to 516 (filled regions) can be prevented from being damaged by deep etching in the process of forming the minute spaces according to the cut-out patterns 721 to 724.

Then, as shown in FIG. 22(D), a fluid insulating material is filled into the minute spaces and hardened to form insulators 521 to 524. As a result, columns 131 to 146 are formed surrounded by the insulators 521 to 524 and the insulators 511 to 516.

In the process of forming the insulators 521 to 524, the columns 131 to 146 are supported with their side faces in contact with the insulators 511 to 516. Therefore, even though a narrow pitch, e.g., equal to or less than 4 μm, results in decreasing the cross sectional area of the columns 131 to 146, it is possible to reduce the risk of various failures, e.g., breakage of the columns 131 to 146, misalignment of the columns 131 to 146, or contact between the columns 131 to 146.

Then, as shown in FIG. 22(E), the columns 131 to 146 are deeply etched to form minute spaces 151 to 166. Thereafter, as shown in FIG. 22(F), columnar conductors 311 to 326 are filled in the minute spaces 151 to 166. In the above, since the columnar conductors 311 to 326 are filled in the minute spaces 151 to 166 surrounded by the hardened insulator 5, TSVs can be certainly formed at a narrow pitch without varying in width and position.

Furthermore, the columns 131 to 146 can be easily, quickly and certainly removed by an etching technology that has been used on the semiconductor substrate 1 such as silicon substrate, for example, a known technology such as a CVD process or a laser drilling process. Thus, the minute spaces 151 to 166 to be filled with the columnar conductors 311 to 326 and therefore the columnar conductors 311 to 326 can be easily, quickly and certainly formed.

3. Other Embodiments

Figure 23:
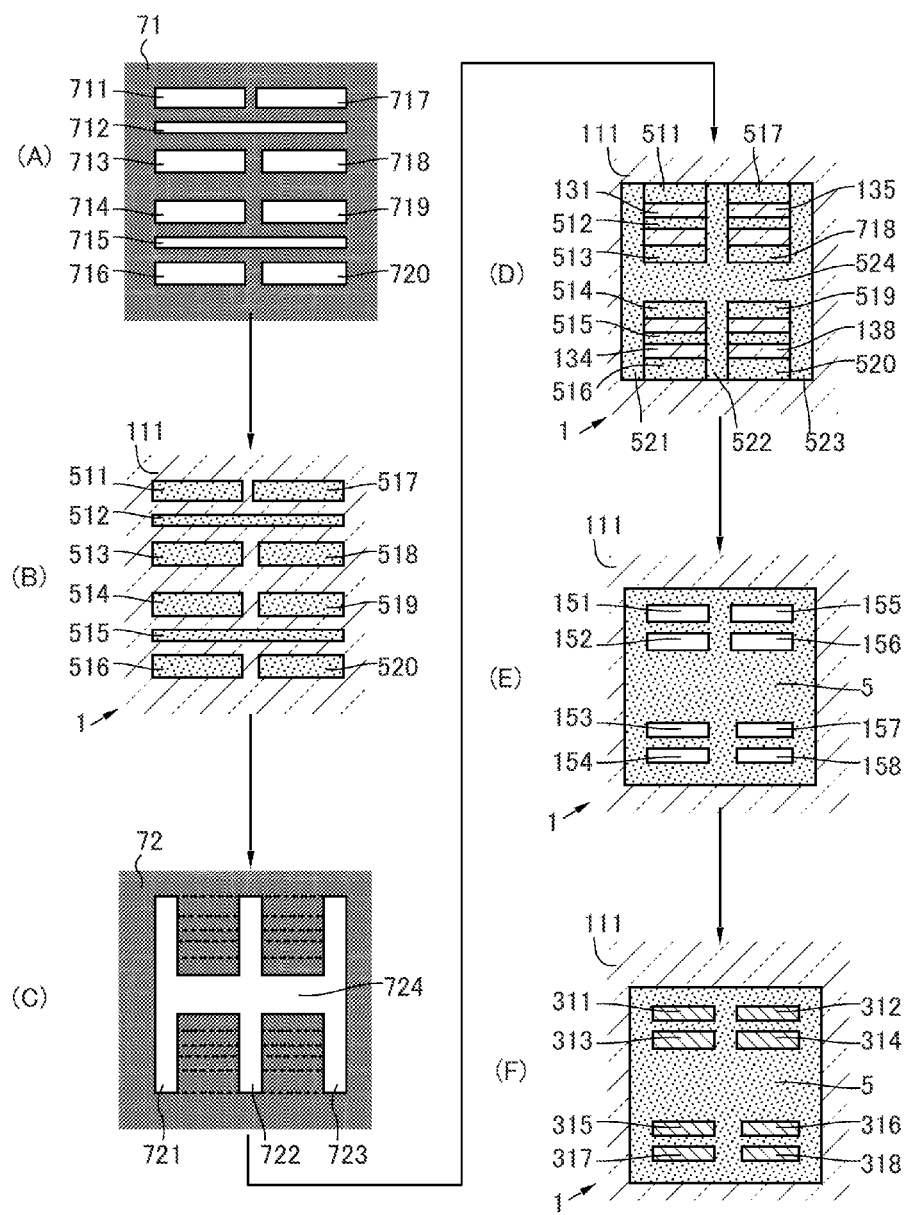
FIG. 23 is a drawing showing yet another method for manufacturing the wiring substrate according to the present invention.

FIG. 23 shows a method for manufacturing the wiring substrate shown in FIG. 2. At first, as shown in FIG. 23(A), minute spaces are formed in the surface 111 of the semiconductor substrate 1 (not shown) according to cut-out patterns 711 to 720 of a resist mask 71. Then, as shown in FIG. 23(B), a fluid insulating material is filled into the minute spaces and hardened to form insulators 511 to 520.

The resist mask 71 has a pair of cut-out patterns (711, 717), a common cut-out pattern 712, a pair of cut-out patterns (713, 718), a pair of cut-out patterns (714, 719), a common cut-out pattern 715 and a pair of cut-out patterns (716, 720). They are arranged at intervals in the longitudinal direction (from top to bottom in the drawing).

Then, as shown in FIG. 23(C), a resist mask 72 having cut-out patterns 721 to 724 is formed on the surface 111 of the semiconductor substrate 1 appearing in FIG. 23(B), and minute spaces are formed according to the cut-out patterns 721 to 724 of the resist mask 72. The cut-out patterns 721 to 723 of the resist mask 72 are formed at right angles to the insulators 511 to 520, while the cut-out pattern 724 overlaps with the insulators 513, 514, 518 and 519.

Then, as shown in FIG. 23(D), a fluid insulating material is filled into the minute spaces and hardened to form insulators 521 to 524. As a result, columns 131 to 138 are formed surrounded by the insulators 521 to 524 and the insulators 511 to 520.

In the process of forming the insulators 521 to 524, the columns 131 to 138 are supported with their side faces in contact with the insulators 511 to 520. Therefore, even though a narrow pitch results in decreasing the cross sectional area of the columns 131 to 138, it is possible to reduce the risk of various failures, e.g., breakage of the columns 131 to 138, misalignment of the columns 131 to 138, or contact between the columns 131 to 138.

Then, as shown in FIG. 23(E), the columns 131 to 138 are etched to form minute spaces 151 to 158. Thereafter, as shown in FIG. 23(F), a wiring substrate is formed with columnar conductors 311 to 318 filled in the minute spaces 151 to 158. Of course, this wiring substrate is also included within the scope of the present invention.

In the above, since the columnar conductors 311 to 318 are filled in the minute spaces 151 to 158 surrounded by the hardened insulator 5, TSVs can be certainly formed at a narrow pitch without varying in width and position.

Furthermore, the columns 131 to 138 can be easily, quickly and certainly removed by an etching technology that has been used on the semiconductor substrate 1 such as silicon substrate, for example, a known technology such as a CVD process or a laser drilling process. Thus, the minute spaces 151 to 158 to be filled with the columnar conductors 311 to 138 and therefore the columnar conductors 311 to 138 can be easily, quickly and certainly formed.

Figure 24:
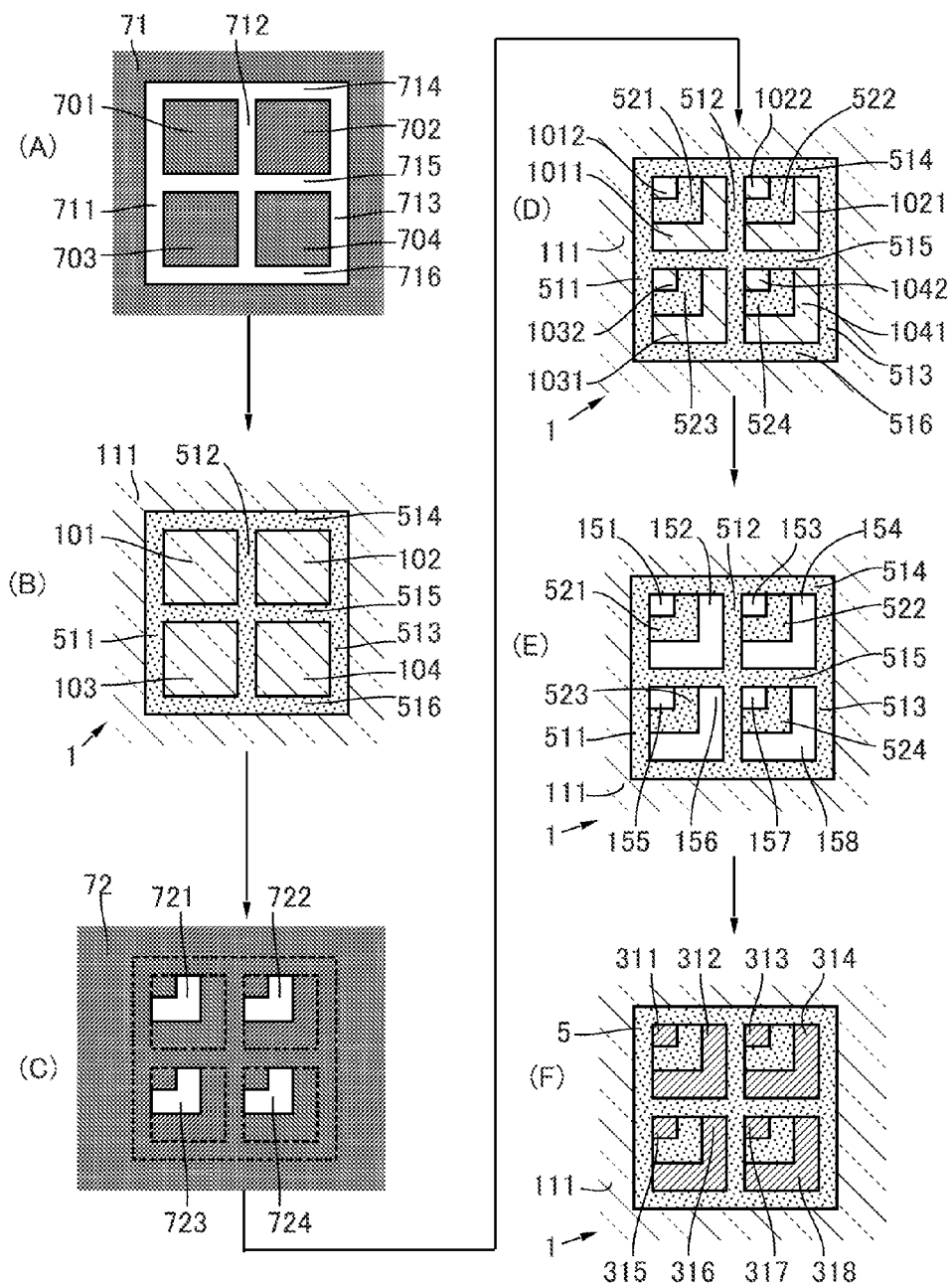
FIG. 24 is a drawing showing yet another method for manufacturing the wiring substrate according to the present invention.

On the other hand, FIG. 24 shows a method for manufacturing the wiring substrate shown in FIG. 3. At first, as shown in FIG. 24(A), minute spaces are formed in the surface 111 of the semiconductor substrate 1 (not shown) according to cut-out patterns 711 to 716 of a resist mask 71. Then, as shown in FIG. 24(B), a fluid insulating material is filled into the minute spaces and hardened to form insulators 511 to 516.

The resist mask 71 has a cut-out pattern that is a combination of a plurality of longitudinal patterns 711 to 713 and a plurality of lateral patterns 714 to 716 and rectangular mask patterns 701 to 704 surrounded by the longitudinal patterns 711 to 713 and the lateral patterns 714 to 716. The number of the longitudinal patterns and the lateral patterns may be arbitrary.

As described above, after the minute spaces are formed according to the cut-out patterns 711 to 716 of the resist mask 71, the insulators 511 to 516 are formed by hardening the fluid insulating material filled into the minute spaces. In this case, the insulators 511 to 516 are formed according to the cut-out patterns 711 to 716 of the resist mask 71, while rectangular columns 101 to 104 are formed surrounded by longitudinal patterns 511 to 513 and lateral patterns 514 to 516.

Then, as shown in FIG. 24(C), a resist mask 72 having cut-out patterns 721 to 724 is formed on the surface 111 of the semiconductor substrate 1 appearing in FIG. 24(B), and minute spaces are deeply etched in the surface 111 of the semiconductor substrate 1 according to the cut-out patterns 721 to 724 of the resist mask 72. The cut-out patterns 721 to 724 of the resist mask 72 are formed at right angles to the cut-out patterns 711 to 716 of the resist mask 71 so that they can meet each other. Specifically, the individual cut-out patterns 721 to 724 are in the shape of an L that is at right angles to the longitudinal patterns 511 to 513 and the lateral patterns 514 to 516, which define the rectangular columns 101 to 104.

Since deep etching according to the cut-out patterns 721 to 724 of the resist mask 72 does not scrape off the insulators 511 to 516, the insulators 511 to 516 (filled regions) can be prevented from being damaged by deep etching in the process of forming the minute spaces according to the cut-out patterns 721 to 724.

Then, as shown in FIG. 24(D), a fluid insulating material is filled into the minute spaces and hardened to form insulators 521 to 524. As a result, the individual rectangular columns 101 to 104 are separated into two columns (1011, 1012) to (1041, 1042) surrounded by the insulators 521 to 524 and the insulators 511 to 516.

In the process of forming the insulators 521 to 524, the two columns (1011, 1012) to (1041, 1042) of the individual rectangular columns 101 to 104 are supported with their side faces in contact with the insulators 511 to 516. Therefore, even though a narrow pitch results in decreasing the cross sectional area of the columns, it is possible to reduce the risk of various failures, e.g., breakage of the columns (1011, 1012) to (1041, 1042), misalignment of the columns (1011, 1012) to (1041, 1042), or contact between the columns (1011, 1012) to (1041, 1042).

Then, as shown in FIG. 24(E), the columns (1011, 1012) to (1041, 1042) are etched to form minute spaces 151 to 158. Thereafter, as shown in FIG. 24(F), a wiring substrate is formed with columnar conductors 311 to 318 filled in the minute spaces 151 to 158. Of course, this wiring substrate is also included within the scope of the present invention.

In the above, since the columnar conductors 311 to 318 are filled in the minute spaces 151 to 158 surrounded by the hardened insulator 5, TSVs can be certainly formed at a narrow pitch without varying in width and position.

Furthermore, the columns (1011, 1012) to (1041, 1042) can be easily, quickly and certainly removed by an etching technology that has been used on the semiconductor substrate 1 such as silicon substrate, for example, a known technology such as a CVD process or a laser drilling process. Thus, the minute spaces 151 to 158 to be filled with the columnar conductors 311 to 138 and therefore the columnar conductors 311 to 138 can be easily, quickly and certainly formed.

Although not described herein, wiring substrates combined with an electronic element as shown in FIGS. 4 and 5 may also be produced, basically, by applying the above-described manufacturing method and a bonding technology.

The present invention is applicable to various types of electronic equipments or devices so as to form TSVs in a semiconductor substrate at a narrow pitch. Typically, such an electronic device can take the form of a three-dimensional system-in-package (3D-SiP). Specifically, it may be a system LSI, a memory LSI, an image sensor, a MEMS or the like. It may also be an electronic device including an analog or digital circuit, a memory circuit such as DRAM, a logic circuit such as CPU or the like or an electronic equipment that is obtained by preparing different types of circuits such as an analog high frequency circuit and a low frequency, low power consumption circuit in different processes and stacking them.

More specifically, it includes most of electronic equipments or devices having an electronic circuit as a functional element, such as a sensor module, an optoelectronic module, a unipolar transistor, a MOS FET, a CMOS FET, a memory cell, integrated circuits (IC) thereof, or various scales of LSIs. In the present invention, integrated circuits called "LSI" include all types of integrated circuits such as a small-scale integration, a medium-scale integration, a large-scale integration, a very-large-scale integration (VLSI), an ultra-large-scale integration (ULSI), and so on.

In the various types of electronic equipments or devices described above, the type of the semiconductor substrate 1 and the shape, arrangement and width of the vertical columnar conductors passing through the semiconductor substrate may be different from those described in this specification. Even then, as long as the structure of the insulator and the relationship of the insulator to the vertical columnar conductors satisfy the requirements, the electronic equipment or device is included in the scope of the present invention.

While the present invention has been particularly shown and described with respect to preferred embodiments thereof, it will be understood by those skilled in the art that various changes in form and detail may be made therein without departing from the spirit, scope and teaching of the invention.

What is claimed is:

1. A wiring substrate comprising a semiconductor substrate, an insulator and a plurality of columnar conductors, the insulator being made of an insulating material filled in a groove or hole provided in the semiconductor substrate, the plurality of columnar conductors being filled in grooves or holes provided in the insulator, the grooves or holes being arranged at a narrow pitch in a plane of the insulator, the insulating material having a Si—O bond obtained by reacting Si particles with an organic Si compound.

2. The wiring substrate of claim 1, wherein the insulating material includes insulating particles, the Si—O bond filling up a space around the insulating particles.

3. A method for manufacturing the wiring substrate of claim 1, comprising:
   leaving a plurality of spaced columns of the semiconductor substrate in the insulator embedded in the semiconductor substrate; and
   removing the columns and filling the columnar conductors in resulting vacant spaces.

4. The method of claim 3, further comprising liquid-phase or solid-phase diffusion bonding of another conductor onto at least one of opposite ends of the columnar conductor with a nanocomposite brazing alloy or nanocomposite particles.

5. The wiring substrate of claim 1, wherein the Si particles are made of Si.

6. The wiring substrate of claim 1, wherein the organic Si compound is $CH_3O-[Si_nO_{n-1}(CH_3)_n(OCH_3)_n]-CH_3$.

7. The wiring substrate of claim 1, wherein the insulating material having the Si—O bond is obtained by formula (1), $$Si+CH_3O-[Si_nO_{n-1}(CH_3)_n(OCH_3)_n]-CH_3 \rightarrow SiO_2 + (C, H, O)\uparrow \quad (1).$$

* * * * *